United States Patent [19]
Noro et al.

[11] Patent Number: 5,412,615
[45] Date of Patent: May 2, 1995

[54] SEMICONDUCTOR INTEGRATED CIRCUIT DEVICE

[75] Inventors: Hiromi Noro; Shinnosuke Kamata; Yoshinori Okajima, all of Kawasaki, Japan

[73] Assignee: Fujitsu Limited, Kawasaki, Japan

[21] Appl. No.: 166,099

[22] Filed: Dec. 14, 1993

[30] Foreign Application Priority Data

Dec. 28, 1992 [JP] Japan .................................. 4-349071

[51] Int. Cl.$^6$ .............................................. G11C 8/00
[52] U.S. Cl. ............................. 365/233; 365/230.08; 365/230.03; 365/194; 327/141
[58] Field of Search .............. 365/233, 230.08, 230.03, 365/194, 189.01, 189.05; 307/590; 364/270, 270.1

[56] References Cited

U.S. PATENT DOCUMENTS

| | | | |
|---|---|---|---|
| 5,077,693 | 12/1991 | Hardee et al. ................... | 365/230.08 |
| 5,206,833 | 4/1993 | Lee ........................................ | 365/233 |
| 5,265,063 | 11/1993 | Kogure ................................ | 365/233 |

Primary Examiner—Joseph A. Popek
Assistant Examiner—Huan Hoang
Attorney, Agent, or Firm—Staas & Halsey

[57] ABSTRACT

This invention provides an apparatus in which a time difference between an eternal clock signal and an internal clock signal is eliminated, and in which a high operation speed even at a high operation frequency is accomplished without causing erroneous circuit operations. A semiconductor integrated circuit device is equipped with a signal generator for generating an internal clock signal for determining an operation timing of an internal circuit from an external clock signal. The semiconductor integrated circuit device includes a delay unit for bringing an edge of the external clock signal into conformity with the edge of the internal clock signal by delaying the output of the signal generator by the time obtained by subtracting a time corresponding to a circuit delay of the signal generator from a time corresponding to some integral multiple of a ½ cycle of the external clock signal.

4 Claims, 8 Drawing Sheets

SEMICONDUCTOR INTEGRATED CIRCUIT DEVICE

BACKGROUND OF THE INVENTION

1. Field of the Invention

This invention relates to a semiconductor integrated circuit device such as a synchronous RAM (Random Access Memory) and a pipeline RAM.

2. Description of the Related Art

As the operation speed of microcomputers, etc., has become higher and higher in recent years, a higher operation speed has been required for peripheral devices such as a memory, and high speed devices such as a synchronous RAM, a pipeline RAM, etc., have been used.

Figure 6:
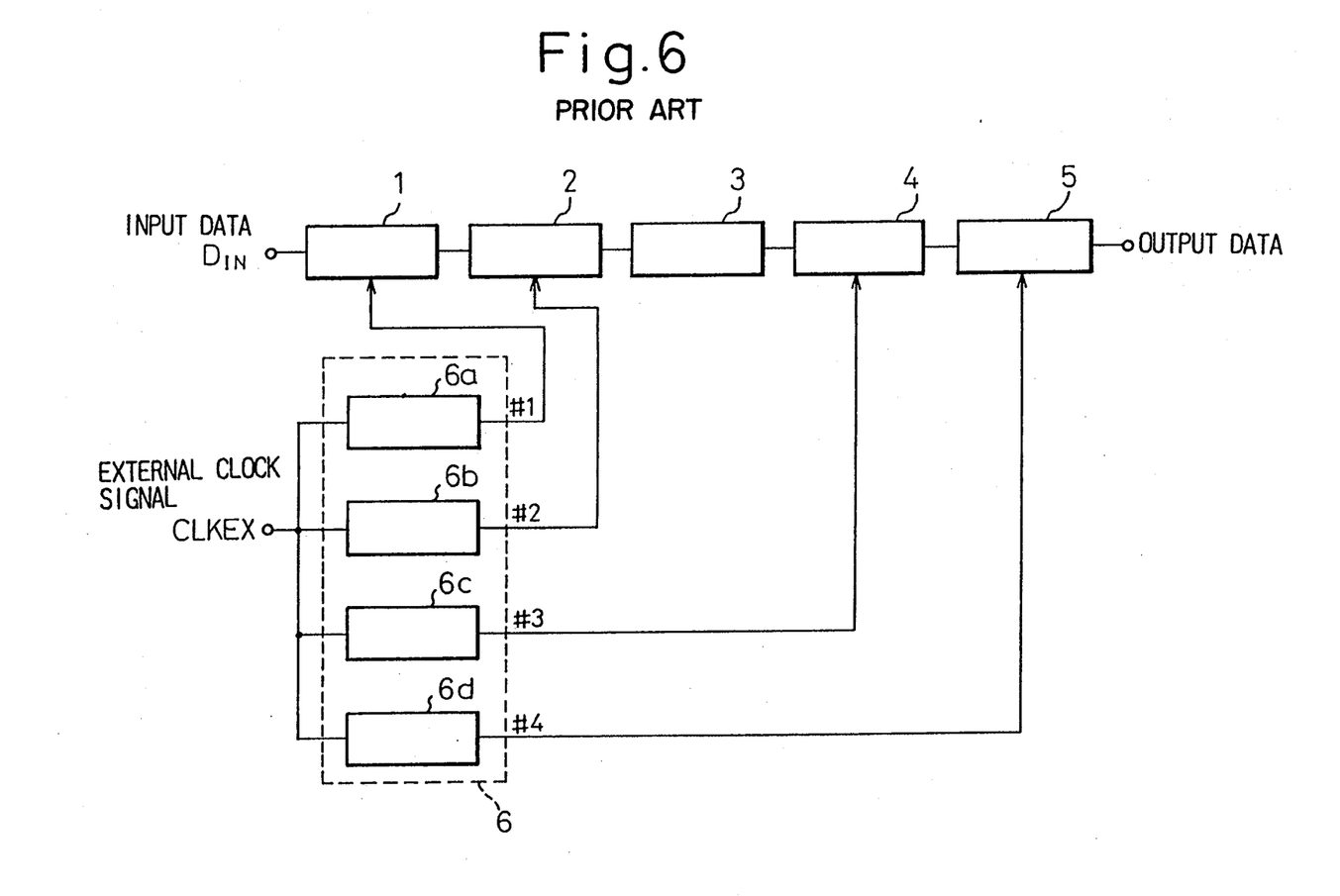
FIG. 6 is a conceptual structural view of principal portions of the prior art.

FIG. 6 of the accompanying drawings is a conceptual block diagram of a pipeline RAM according to the prior art. This pipeline RAM includes a first pipeline stage for inputting an input signal (which is an address signal) into an input buffer 1, a second pipeline stage for decoding the input signal by row/column decoders 2, a third pipeline stage for latching data read out from a memory cell array 3 (the output of a sense amplifier 4) in accordance with the decoding result, and a fourth pipeline stage for outputting the latch data through an output buffer 5. This pipeline RAM can accomplish a high speed operation in accordance with the number of pipeline stages by the parallel operations of the first to fourth pipeline stages.

Here, the operation of each pipeline stage is determined by first to fourth internal clocks CLKIN #1 to #4, and these internal clock signals CLKIN #1 to #4 are generated by each block 6a to 6d (inclusive of an input buffer and a clock generation portion) of a signal generation circuit 6 on the basis of an external clock signal CLKEX.

However, the semiconductor integrated circuit device according to the prior art described above involves the problem that when the frequency of the input signal DIN or that of the external clock signal CLKEX is increased, matching cannot be established between the data at each pipeline stage and the external clock. Therefore the circuit operates erroneously, and this is a problem which must definitely be solved in order to further improve operation speed.

Figure 7:
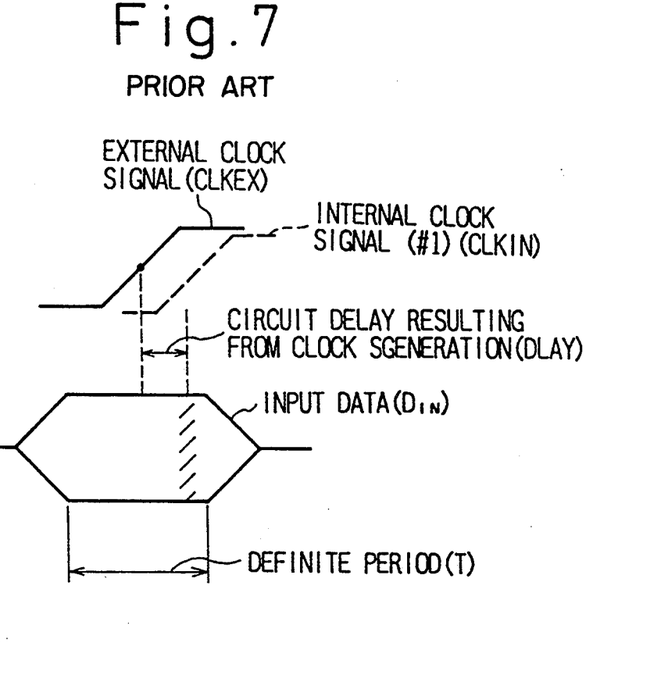
FIG. 7 is an operation waveform diagram of a prior art example.

FIG. 7 is a timing chart of the internal clock signal CLKIN #1 that determines the operation of the first pipeline stage and the input signal DIN of this stage, for example. In this timing chart, the shift timing of the internal clock signal CLKIN #1 (the rise shift timing for the sake of convenience) exists within a definite period of the input signal DIN. Therefore, the signal can be input without any problem. However, when the frequency of the input signal DIN is increased, the definite period described above becomes shorter, so that the shift timing of the internal clock signal CLKIN #1 is likely to stray from the definite period T or is likely to enter the definite period of a next input signal.

SUMMARY OF THE INVENTION

It is therefore an object of the present invention to provide a useful technology capable of eliminating the time difference between the external clock signal CLKEX and the internal clock signal CLKIN, and capable of accomplishing a higher operation speed without causing an erroneous operation even at a higher frequency.

To accomplish the object described above, the present invention provides a semiconductor integrated circuit device equipped with signal generation means for generating an internal clock signal for determining an operation timing of an internal circuit from an external clock signal, wherein a timing at which the internal clock signal is generated is brought into conformity with an operation timing point of the external clock signal which is generated earlier than an operation timing point of the external clock signal which should originally correspond to the generation timing of the internal clock signal.

More particularly, the timing for generating the internal clock signal described above is brought into conformity with the operation timing point of the external clock signal which is generated earlier by a time corresponding to some integral multiple of one half ($\frac{1}{2}$) of one cycle of the external clock signal, than the operation timing point of the external clock signal which should originally correspond to the generation timing of the internal clock signal.

These and other objects and novel features of the present invention will become more apparent from the following description in connection with the accompanying drawings.

DETAILED DESCRIPTION OF THE PREFERRED EMBODIMENTS

Hereinafter, a semiconductor integrated circuit device according to a preferred embodiment of the present invention will be described in detail with reference to the accompanying drawings.

As described above, in a semiconductor integrated circuit device including signal generation means for generating an internal clock signal for determining an operation timing of an internal circuit from an external clock signal, the semiconductor integrated circuit device according to the present invention is fundamentally constituted in such a manner that a timing for generating the internal clock signal is brought into conformity with the operation timing point of the external clock signal which is generated earlier by some integral multiples of the $\frac{1}{2}$ cycle of the external clock signal such as $\frac{1}{2}$ cycle, one cycle, a 3/2 cycle, two cycles, etc., than the operation timing point of the external clock signal which should originally correspond to the generation timing of the internal clock signal.

To solve the problem with the prior art already described in that the delay is unavoidable between the operation timing point of the external clock signal and the generation timing point of the internal clock signal, the fundamental technical construction of the semiconductor integrated circuit device according to the present invention resides in the construction wherein the operation timing point for generating the internal clock signal is set forward to match the operation timing of the external clock signal which has already been generated earlier than the operation timing point of the external clock signal which should originally correspond to the generation timing of the internal clock signal.

Further, the semiconductor integrated circuit device according to the present invention constitutes delay means for bringing the edge of the external clock signal into substantial conformity with that of the internal clock signal by deviating the output of signal generation means by the time obtained by subtracting the time corresponding to a circuit delay of the signal generation means from the time corresponding to some integral multiple of ½ cycle of the external clock signal and using this difference time as the internal clock signal, after the operation timing point for generating the internal clock signal is set forward to match the operation timing of the external clock signal which has already been generated earlier than the operation timing point of the external clock signal which should originally correspond to the generation timing of the internal clock signal as described above.

FIG. 1 is a time relationship diagram between the external clock signal (CLKEX) and the internal clock signal (CLKIN). Each upward arrow represents the shift timing (the rise shift for convenience) of each clock signal.

Figure 1A:
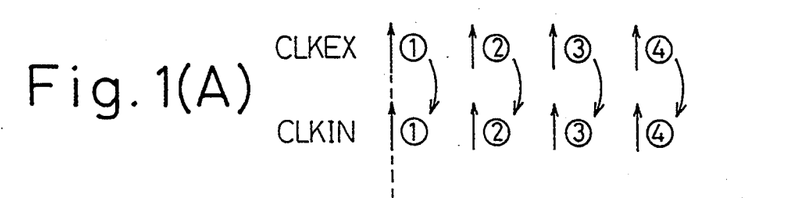
FIG. 1 is an explanatory view useful for explaining the principle of the present invention.
Figures 1B, 1C:
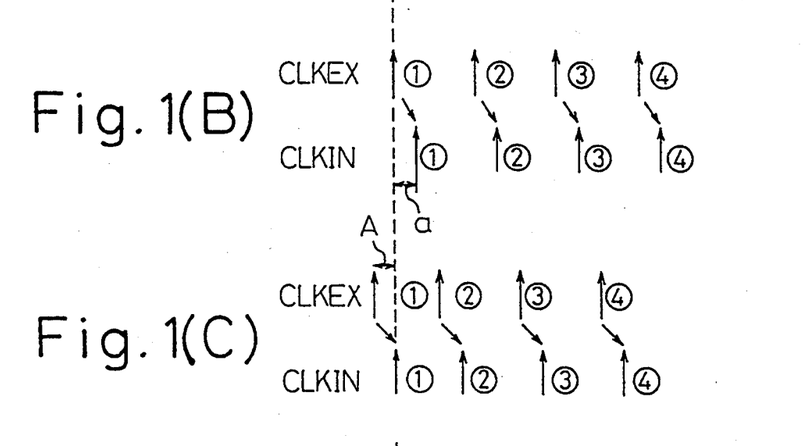

As shown in the upper row (A), when the time difference is zero between the external clock CLKEX and the internal clock CLKIN, the input signal can be received at the shift timing of the internal clock CLKIN and hence, the shift timing of the external clock CLKEX, and the semiconductor integrated circuit device can cope with input signals and external clock signals having a high frequency. However, a circuit delay exists for generating the internal clock CLKIN, in practice. Accordingly, as shown in the second row (B), a timing difference (called "a" for convenience) exists between the external clock CLKEX and the internal clock CLKIN, though the difference itself is limited. In other words, since the input signal is received belatedly by this time a, there occurs the afore-mentioned problem in that the input timing, that is, the shift timing of the internal clock, deviates from the definite period of the input signal, or enters the definite period of the next input signal.

As shown in the third row (C), this problem can be avoided by advancing beforehand the external clock CLKEX by the time a, but problems will certainly occur in the other peripheral circuits because this external clock is used in the other peripheral circuits. Accordingly, this method cannot be employed in practice.

Figure 1D:
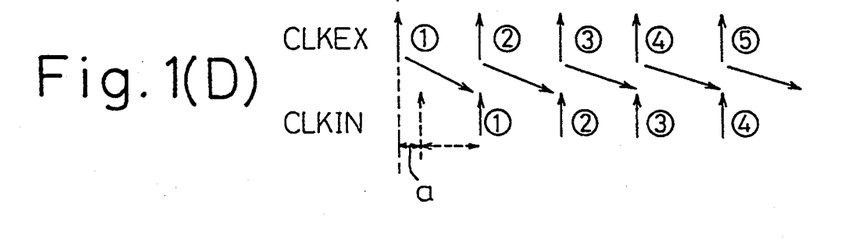

Accordingly, as shown in the fourth row (D), according to the present invention, the time difference between the external clock CLKEX and the internal clock CLKIN is the sum of the time difference a described above and the delay time of the delay means. In other words, the timing coincides between the external clock CLKEX 2 and the internal clock CLKIN 1, between the external clock CLKEX 3 and the internal clock CLKIN 2, . . . , between the external clock CLKEX 5 and the internal clock CLKIN 4, and so forth, as can be clearly understood from the diagram. Accordingly, the apparent relationship between the external clock CLKEX and the internal clock CLKIN in this case is the same as that of the upper row (A), and the input signal can be received at the shift timing of the external clock CLKEX. In other words, the semiconductor integrated circuit device can cope with the input signals and the external clock signals having a high frequency.

Hereinafter, a preferred embodiment of the present invention will be described with reference to the drawings.

FIGS. 2 to 5 show the semiconductor integrated circuit device according to an embodiment of the present invention, which represents an application example of the invention to a pipeline RAM.

Figure 2:
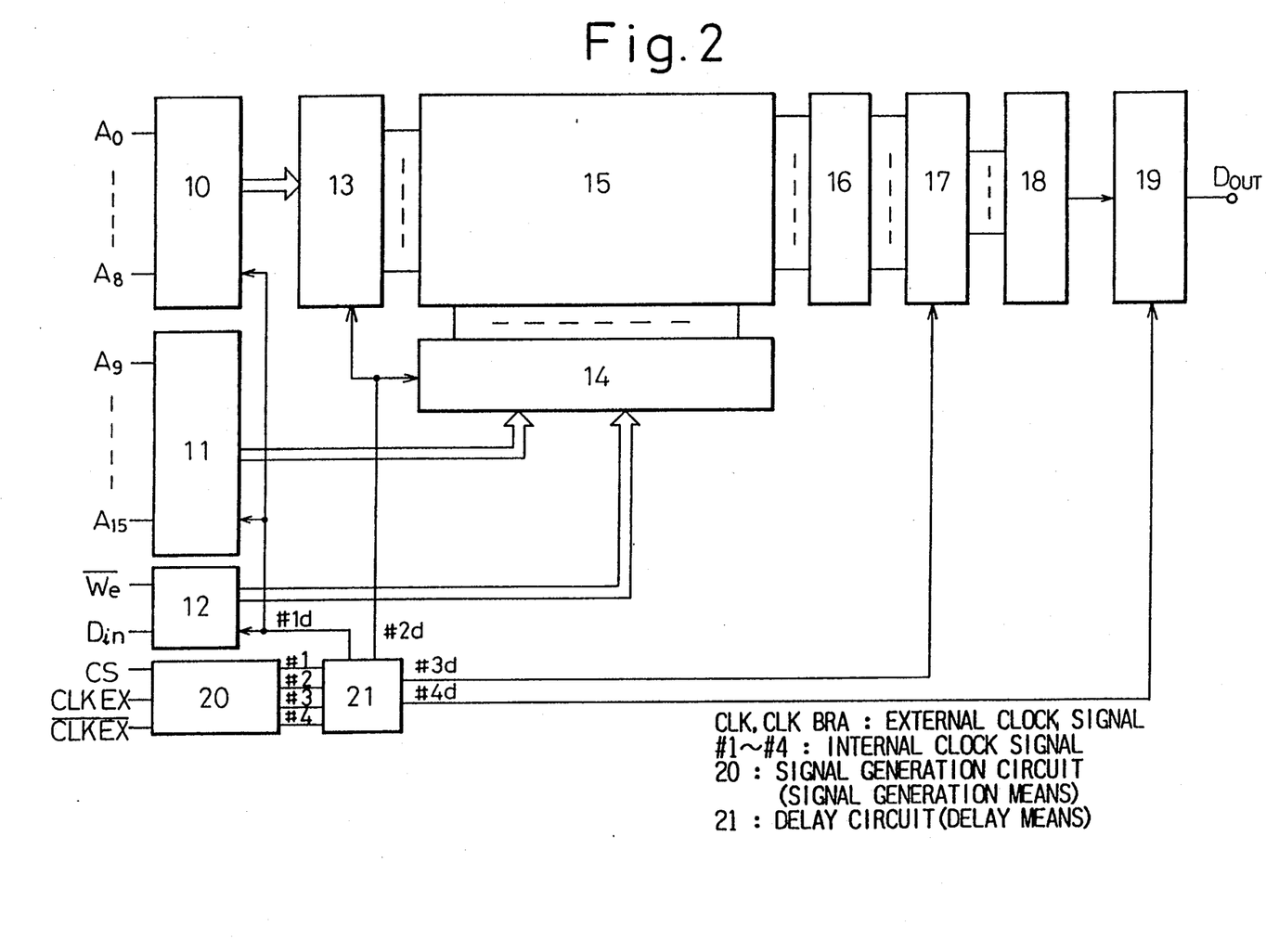
FIG. 2 is an overall block diagram of an embodiment of the present invention.

In FIG. 2, reference numeral 10 denotes a row address register for inputting nine low order bits $A_0$ to $A_8$ of an address signal (input signal) at the shift timing of the first internal clock signal CLKIN #1$d$, and reference numeral 11 denotes a column address register which inputs the remaining seven bits $A_9$ to $A_{15}$ at the shift timing of the first internal address signal CLKIN #1$d$. Reference numeral 12 denotes a data register which inputs write data $D_{in}$ (input signal) at the shift timing of the first internal address signal CLKIN #1$d$, reference numeral 13 denotes a row decoder which decodes the row address at the shift timing of the second internal clock signal CLKIN #2$d$ and reference numeral 14 denotes a column decoder which likewise decodes the column address at the shift timing of the second internal clock signal CLKIN #2$d$. Reference numeral 15 denotes a memory cell array comprising a large number of memory cells arranged in a matrix, reference numeral 16 denotes a first sense amplifier which amplifies and reads out the data inside a specific memory cell which is accessed by the outputs of the row and column decoders 13, 14, reference numeral 17 denotes a multiplexer/latch circuit which multiplexes the output of the first sense amplifier 16 at the shift timing of the third internal clock CLKIN #3$d$ and latches the same (hereinafter this multiplexer/latch circuit will be called the "latch circuit"), reference numeral 18 denotes a second sense amplifier which amplifies the data latched by the latch circuit, and reference numeral 19 denotes an output register which reads out the output of the second sense amplifier 18 at the shift timing of the fourth internal clock signal CLKIN #4$d$ and outputs it as the read data $D_{out}$ to the outside. Incidentally, when the memory cell array 15 is divided into a plurality of blocks, the multiplexer described above selects the output of any of these blocks.

Here, reference numeral 20 denotes a signal generation circuit (signal generation means) for generating internal clock signals CLKIN #1 to #4 for determining the operation timings of internal circuits such as the column address register 10, the row address register 11, the data register 12, the row/column decoders 13, 14, the latch circuit 17 and the output register 19 from the external clock signal CLKEX (and the $\overline{CLKEX}$). These internal clock signals CLKIN #1 to #4 are passed through a delay circuit 21 (delay means), are provided with respective delay times, and are converted to the first to fourth internal clock signals CLKIN #1$d$ to

4d. Incidentally, symbol $\overline{We}$ denotes a write enable signal and CS denotes a chip select signal.

Figure 3:
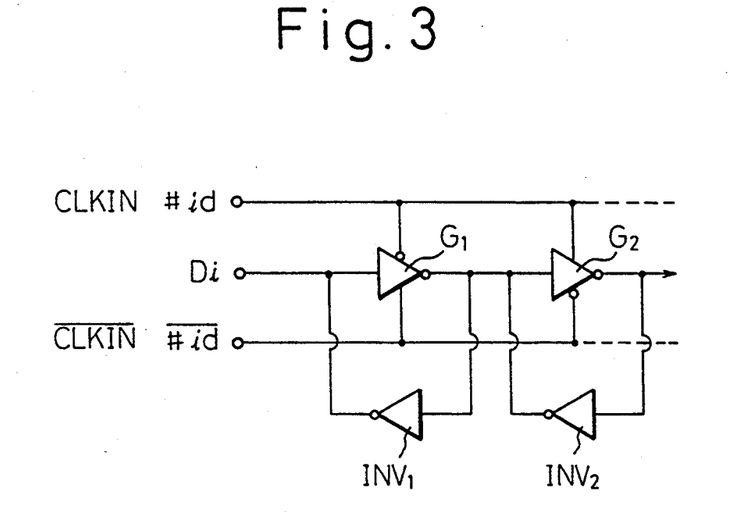
FIG. 3 is a structural view of a register in the embodiment.

FIG. 3 shows a circuit example of the column address register 10, the row address register 11, the data register 12 or the output register 19, wherein inverter gates $INV_1$, $INV_2$, . . . facing in opposite directions, are connected in parallel with CMOS gate switches $G_1$, $G_2$, . . . having a multi-stage connection. An input signal Di sequentially propagates through these gate switches in synchronism with the internal clock signal CLKIN #id.

Figure 4:
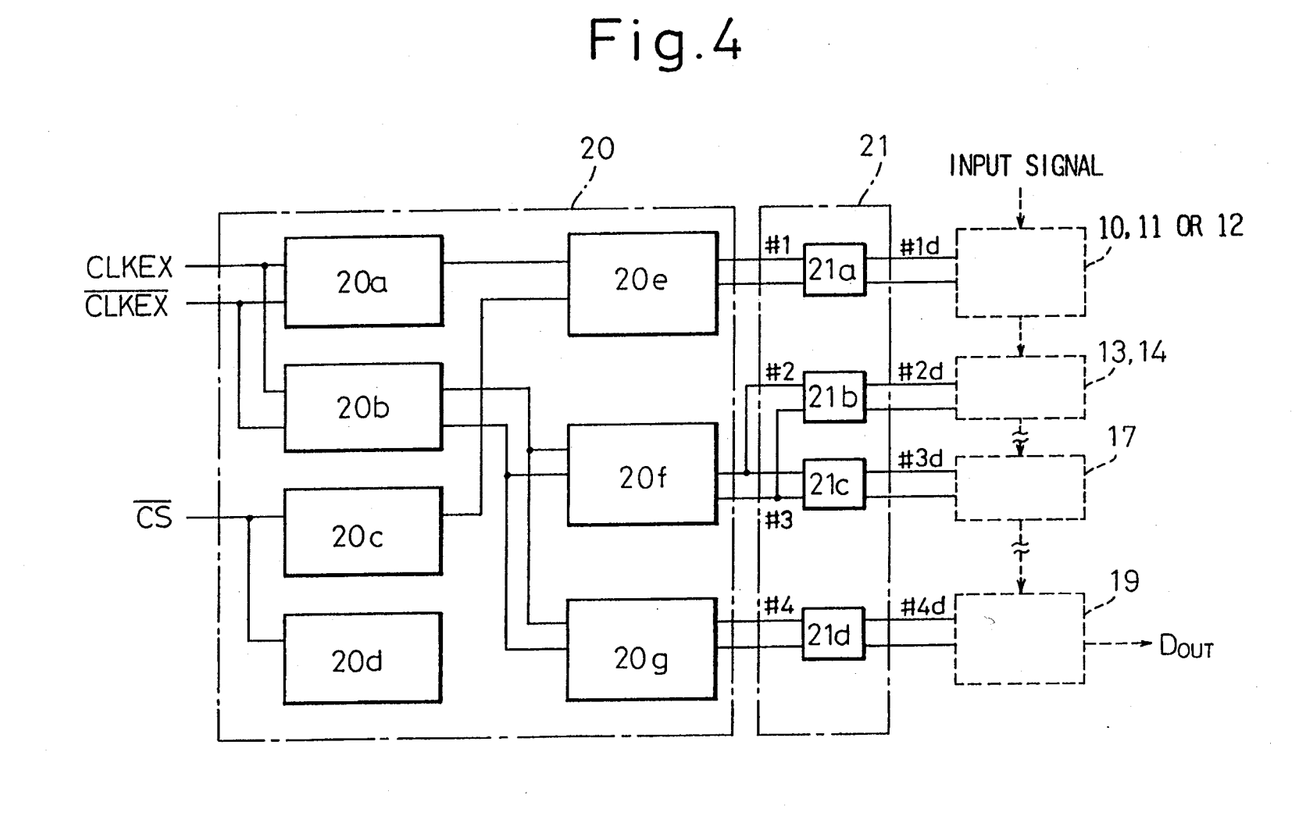
FIG. 4 is a block diagram of principal portions of the embodiment.

FIG. 4 is a block diagram of the principal portions inclusive of the signal generation circuit 20 and the delay circuit 21. The signal generation circuit 20 includes input buffers 20a, 20b for the external clock signals CLKEX ($\overline{CLKEX}$) and input buffers 20c, 20d for the chip select signals CS as well as several clock generation portions 20e to 20g for generating the internal clock signals CLKIN #1 to #4 for controlling the operation of each pipeline stage. The delay circuit 21 includes delay portions 21a to 21d for the first to fourth internal clock signals CLKIN #1d to #4d, respectively, and each of these delay portions 21a to 21d has a predetermined delay time in consideration of the circuit delay for each internal clock signal CLKIN in the signal generation circuit 20.

Figure 5:
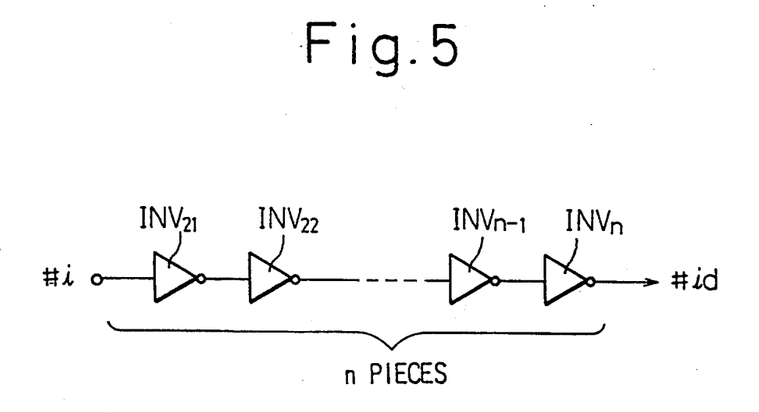
FIG. 5 is a structural view of a delay portion of the embodiment.

FIG. 5 shows an example of the gate delay circuit of the delay portions 21a to 21d. In this example, a desired delay time is adjusted by the number of connection stages of the inverter gates $INV_{21}$ to $INV_{22}$, . . . , $INV_n$. Since a typical delay time per stage of the inverter gate is approximately 200 ps, a delay time of n×200 ps can be obtained.

Next, the operation will be explained.

First, we consider the case where the cycle of the external clock signal CLKEX is TC and the timing for generating the internal clock signal is generated from the external clock signal which has been generated earlier by the time corresponding to some integral multiple of one half cycle of the external clock signal CLKEX, that is, $\frac{1}{2}$TC.

In other words, in the present invention, the timing for generating the internal clock signal is determined from the external clock signal which has already been generated earlier than the operation timing point of the external clock signal which should originally correspond to the generation timing of this internal clock signal, or more concretely, from the external clock signal which has been generated earlier by the time corresponding to some integral multiple of one half cycle $\frac{1}{2}$TC of one cycle of the external clock signal CLKEX. Accordingly, this early external clock signal exhibits the rise function in some case or the fall function in the other. However, this difference renders no problem at all when the operation timing for generating the internal clock signal is determined in the present invention.

In the embodiment of the present invention which follows, the timing for generating the internal clock signal is brought into conformity with the operation timing of the external clock signal which has been generated earlier by the time TC, which corresponds to double the half cycle $\frac{1}{2}$TC of the cycle of the external clock signal, than the operating timing point of the external clock signal which should originally correspond to the generation timing of this internal clock signal.

After the generation timing of the internal clock signal CLKIN is determined in the way described above, the present invention sets the predetermined delay time by the following method so that the timing at which the internal clock signal CLKIN occurs in practice substantially coincides with the rise of the next or subsequent external clock signal CLKEX within a region where the input data is definite, or in other words, coincides substantially with the rise of the external clock signal CLKEX at which the internal clock signal CLKIN should be originally generated.

In other words, the delay time $TD_1$ of the delay portion 21a for the first internal clock CLKIN #1d is given by the following formula (1) where $td_1$ is the total circuit delay of the input buffers 20a, 20c and the clock generation portion 20e:

$$TD_1 = TC - td_1 \tag{1}$$

where TC is one cycle of the external clock signal (i.e. $\frac{1}{2}TC \times 2$).

The delay times $DR_{\frac{2}{3}}$ of the delay portions 21b, 21c for the second and third internal clocks CLKIN #2d and #3d are given likewise by the following formula (2) where $td_{\frac{2}{3}}$ represents the total circuit delay of the input buffer 20b and the clock generation portion 20f, and the delay time $TD_4$ of the delay portion 21d for the fourth internal clock #4d is given by the following formula (3) where $td_4$ represents the total circuit delay of the input buffers 20b, 20d and the clock generation portion 20g:

$$TD_{\frac{2}{3}} = TC - td_{\frac{2}{3}} \tag{2}$$

$$TD_4 = TC - td_4 \tag{3}$$

In other words, the operations of the internal circuits such as the column address register 10, the row address register 11 (when the input signals are the address signals $A_0$ to $A_{15}$ and the data register 12 when the input signals are the write data $D_{in}$), the row/column decoders 13, 14, the latch circuit 17 and the output register 19 are determined by the first to fourth internal clock signals CLKIN #1d to #4d which shift with the delay time of $TD_1 + td_1$, $TD_{\frac{2}{3}} + td_{\frac{2}{3}}$ and $TD_4 + td_4$ from the shift timing of the external clock signal CLKEX ($\overline{CLKEX}$), respectively. Since these times $TD_1 + td_1$, $TD_{\frac{2}{3}} + td_{\frac{2}{3}}$ and $TD_4 + td_4$ are all substantially equal to TC, the operations of these internal circuits are determined after all by the internal clock signals CLKIN #1d to #4d which are delayed by TC from the shift timing of the external clock signal CLKEX ($\overline{CLKEX}$).

According to this embodiment, therefore, the shift timing of the external clock signal CLKEX ($\overline{CLKEX}$) and that of the internal clock signals CLKIN #1d to #4d can be brought into conformity with one another, and the time difference between both clock signals can be eliminated. Accordingly, even when the frequency of the address signal is raised, for example, matching between the data and the internal clock does not collapse in each pipeline stage, and this embodiment can provide technology which is useful for accomplishing a higher speed operation.

Though the embodiment given above illustrates the application of the present invention to the pipeline RAM, the embodiment is in no way limitative. In short, the present invention can be applied to all the semiconductor integrated circuit devices of a high speed operation type so long as the internal clock signals synchronized with the external clock signal are generated inside the chip and the internal operations are determined in accordance with the internal clock signals. Though the delay circuit 21 is constituted by the inverters in the embodiment given above, it may be constituted by a CR circuit, for example.

As described above, the gist of the present invention resides, in short, in that the semiconductor integrated circuit device includes a clock buffer, for example, having a delay circuit which has an appropriate delay time and switching of the output (to serve as the internal clock signal) which is in substantial conformity with switching of the external clock signal. This clock buffer may include a delay circuit having an appropriate delay time such that switching of the input thereof substantially coincides with switching of the external clock signal, or a delay circuit having an appropriate delay time such that switching of the internal signal substantially coincides with switching of the external clock signal.

The delay circuit may be constituted by GATE-Delay or by a PLL (Phase-Lock-Loop) circuit or by an internal register circuit. Particularly when the delay circuit is constituted by the PLL circuit, the delay time can be varied in accordance with the change of the frequency of the external clock signal CLKEX, and this is desirable from the aspect of convenience.

In the embodiment given above, the generation timing of the internal clock signal CLKIN to serve as the input signal of the internal register is delayed by just one cycle (TC) of the external clock signal from the timing of the external clock signal CLKEX which switches in substantial conformity with the output, the input or the internal signal, but this delay time is not particularly limitative but may be at least some integral multiple of $\frac{1}{2}$ of TC.

Further, internal switching may be effected by an input buffer, an output buffer, a word driver or a sense amplifier. In the case of a cell division type semiconductor memory device, it may be effected by a multiplexer, a pre-sense amplifier, a main sense amplifier or a local word driver.

Next, another embodiment of the present invention, wherein the generation timing of the internal clock signal is brought into conformity with the operation timing of the external clock signal, which has been generated earlier by the time corresponding to $\frac{1}{2}$TC corresponding to one half of the cycle TC of the external clock signal, than the operation timing point of the external clock signal which should originally correspond to the generation timing of the internal clock signal, in the semiconductor integrated circuit device of the present invention, will be explained with reference to FIG. 8.

Figure 8A:
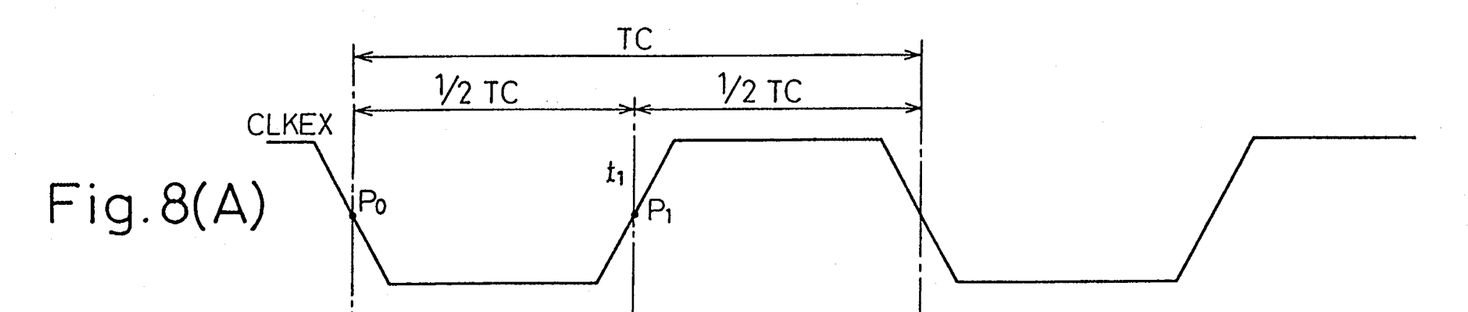
FIG. 8 is a waveform diagram of an external block signal and an internal clock signal in an embodiment of a semiconductor integrated circuit device according to the present invention.

FIG. 8(A) shows the operation waveform of the external clock signal CLKEX. The cycle of this external clock signal is TC and one half of its cycle is $\frac{1}{2}$TC.

Figure 8B:
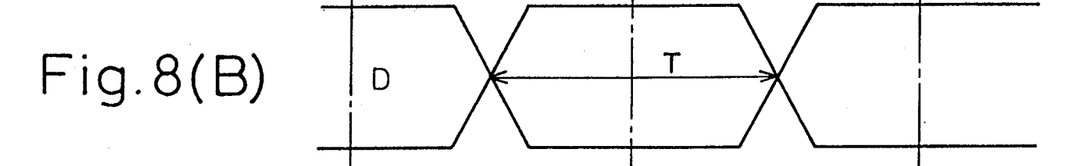
Figure 8C:
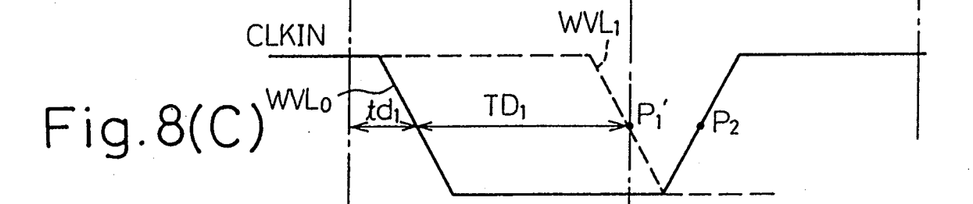

On the other hand, FIG. 8(B) shows the input data signal, and its definite time T is set with a predetermined delay time from the external clock signal CLKEX. FIG. 8(C) shows the operation waveform of the internal clock signal CLKIN. In the method of generating the internal clock signal according to the prior art, the external clock signal CLKEX rises at the time ti of this external clock signal CLKEX, and in order to raise the internal clock signal CLKIN at a point Pi exceeding a predetermined threshold value, and reads out the input data DIN only at the point P2 when the internal clock signal CLKIN exceeds a predetermined threshold level. For this reason, there are many cases where the input data DIN cannot be read out reliably and the possibility is high that wrong data will be output. In contrast, in the present invention, the timing at which the internal clock signal CLKIN rises so as to read the input data DIN is generated earlier by the time corresponding to $\frac{1}{2}$TC which is one half of the cycle of the external clock signal CLKEX, than the operation timing signal P1 of the external clock signal CLKEX which should originally correspond to the generation timing of the internal clock signal, that is, at the operation timing point P0 of the external clock signal.

In other words, as shown in FIG. 8, the external clock signal CLKEX falls at this operation timing point P0, and the falling waveform WVL0 of the internal clock signal CLKIN corresponding to this timing is detected. Since this waveform WVL0 of the internal clock signal CLKIN has a delay time delayed by a predetermined time tdi from the external clock signal CLKEX, the internal clock signal CLKIN is output at the point which is delayed from the operation timing point P0 in the external clock signal CLKEX by the difference delay time TDi (TDi=$\frac{1}{2}$TC−tdi) obtained by subtracting this time tdi from one half of the cycle of the external clock signal CLKEX, that is, $\frac{1}{2}$TC. As a result, as represented by the waveform WVLi of the internal clock signal CLKIN in FIG. 8(C), the internal clock signal CLKIN can be operated at the timing substantially synchronized with the operation timing of the external clock signal CLKEX at the time ti.

Figure 8D:
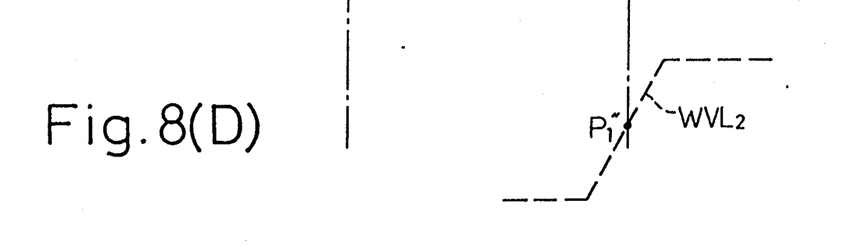

The waveform WVLi of the internal clock signal CLKIN naturally exhibits the fall. It is therefore desirable to dispose a circuit for judging at which level of the waveform WVLi the input data DIN must be read. As shown in FIG. 8(D), it is also possible to invert the waveform WVLi by utilizing a circuit for inverting the internal clock signal CLKIN, and to shape the waveform into the same waveform as that of the external clock signal CLKEX at the operation timing point Pi.

As described above, the present invention disposes delay means for delaying the output of signal generation means by the time obtained by subtracting the time corresponding to the circuit delay of the signal generation means from the time corresponding to some integral multiple of $\frac{1}{2}$ cycle of the external clock signal. Accordingly, the time difference between the external clock signal and the internal clock signal can be apparently eliminated, and a higher operation speed can be accomplished without erroneous operation even when a semiconductor integrated circuit device is used at a higher frequency.

We claim:

1. A semiconductor integrated circuit device equipped with signal generation means for generating an internal clock signal for determining an operation timing of an internal circuit from an external clock signal, characterized in that a timing at which said internal clock signal is generated is brought into conformity with an operation timing point of a first external clock signal which is generated earlier than an operation timing point of a second external clock signal, which has been previously scheduled to be an operation timing point corresponding to the generation timing of said internal clock signal.

2. A semiconductor integrated circuit device equipped with signal generation means for generating an internal clock signal for determining an operation timing of an internal circuit from an external clock signal, characterized in that a timing at which said internal clock signal is generated is brought into conformity with an operation timing point of a first external clock signal which is generated earlier than an operation timing point of a second external clock signal which has been previously scheduled to be an operation timing point corresponding to the generation timing of said internal clock signal, wherein the timing for generating said internal clock signal is brought into conformity with the operation timing point of the first external clock signal which is generated earlier by a time corresponding to some integral multiple of $\frac{1}{2}$ of one cycle of said external clock signal, than the operation timing point of the second external clock signal, which has previously been scheduled to be an operation timing point corresponding to the generation timing of said internal clock signal.

3. A semiconductor integrated circuit device equipped with signal generation means for generating an internal clock signal for determining an operation timing of an internal circuit from an external clock signal, characterized by including delay means for bringing an edge of said internal clock signal into substantial conformity with an edge of said external clock signal by deviating an output of said signal generation means by the time obtained by subtracting a time corresponding to a circuit delay of said signal generation means from a time corresponding to some multiple of a $\frac{1}{2}$ cycle of said external clock signal, and then generating said internal clock signal.

4. A pipeline semiconductor memory comprising:
input buffers inputting external clock signals;
a plurality of clock generation portions generating a plurality of internal clock signals synchronized with said external clock signal;
a plurality of delay portions outputting internal clock signals for each of a plurality of pipeline stages by delaying said internal clock signals by a predetermined time; and
internal circuits forming each stage of a plurality of said pipeline stages, the operation timings of said internal circuits being restricted by said internal clock signals.

* * * * *